United States Patent
Gloo et al.

(10) Patent No.: US 9,070,880 B2
(45) Date of Patent: Jun. 30, 2015

(54) METHOD OF MANUFACTURING A TAPE CAST MULTILAYER SONAR TRANSDUCER

(75) Inventors: Todd C. Gloo, Manlius, NY (US); James D. Weigner, Clay, NY (US); Raymond Porzio, LaFayette, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 1159 days.

(21) Appl. No.: 12/977,537

(22) Filed: Dec. 23, 2010

(65) Prior Publication Data

US 2012/0163130 A1   Jun. 28, 2012

(51) Int. Cl.
*H01L 41/277* (2013.01)
*H01L 41/29* (2013.01)
*H01L 41/18* (2006.01)
*H01L 41/187* (2006.01)
*H01L 41/27* (2013.01)
*H01L 41/337* (2013.01)
*H01L 41/273* (2013.01)
*H01L 41/293* (2013.01)
*H01L 41/297* (2013.01)
*H01L 41/338* (2013.01)
*H03H 3/02* (2006.01)

(52) U.S. Cl.
CPC ............... *H01L 41/277* (2013.01); *Y10T 29/42* (2015.01); *Y10T 29/49126* (2015.01); *Y10T 29/49147* (2015.01); *Y10T 29/49155* (2015.01); *H01L 41/183* (2013.01); *H01L 41/187* (2013.01); *H01L 41/27* (2013.01); *H01L 41/29* (2013.01); *H01L 41/337* (2013.01); *H03H 3/02* (2013.01); *H01L 41/273* (2013.01); *H01L 41/293* (2013.01); *H01L 41/297* (2013.01); *H01L 41/338* (2013.01)

(58) Field of Classification Search
CPC ... H01L 41/277; H01L 41/183; H01L 41/187; H01L 41/293; H01L 41/297; H01L 41/337; H01L 41/338; H03H 3/02; Y10T 29/42; Y10T 29/49126; Y10T 29/49147; Y10T 29/49155

USPC ......... 29/25.35, 842, 846, 830; 310/311, 331, 310/348, 358, 365; 252/62.9 PZ

See application file for complete search history.

(56) References Cited

U.S. PATENT DOCUMENTS

| | | | |
|---|---|---|---|
| 5,089,739 | A | 2/1992 | Takahashi et al. |
| 5,237,239 | A | 8/1993 | Inoue et al. |
| 6,467,140 | B2 * | 10/2002 | Gururaja ...................... 29/25.35 |
| 6,573,639 | B1 | 6/2003 | Heinz et al. |
| 6,620,752 | B2 * | 9/2003 | Messing et al. ......... 252/62.9 PZ |
| 2006/0163974 | A1 * | 7/2006 | Park et al. ...................... 310/348 |

FOREIGN PATENT DOCUMENTS

JP           63136677 A  *  6/1988  .................. 29/25.35

* cited by examiner

*Primary Examiner* — A. Dexter Tugbang
(74) *Attorney, Agent, or Firm* — Howard IP Law Group, PC

(57) ABSTRACT

A manufacturing process provided herein pertains to a single-piece, multi-layer piezoelectric stack in a sonar transducer element utilized in acoustic arrays requiring many thousands of elements. A slurry formed by mixing ceramics, powders, and binders is filtered, dried and cast into a thin film on a moving substrate. When the film has dried, it is removed from the substrate and layered into piezoelectric stacks. Screening a pattern of conductive platinum ink onto a desired layer forms electrodes. Applied heat and pressure forms a unitary body with electrically accessible layers. Burning removes the binders and sintering produces a final density. Dicing the body exposes the desired electrode polarities. A strip of conductive material is applied to connect the electrodes of like polarity and the ceramic parts are polarized. The transducer elements may be arrayed to conform to the curved surfaces such as a ship's hull.

7 Claims, 10 Drawing Sheets

METHOD OF MANUFACTURING A TAPE CAST MULTILAYER SONAR TRANSDUCER

FIELD OF INVENTION

The present invention relates to sonar transducers, and more particularly to sonar transducers produced utilizing a multilayered fabrication and assembly process.

BACKGROUND

Naval architects and electronic warfare designers have expressed interest in large area conformal sonar arrays for applications where the transducers are electronically scanned to transmit and receive acoustic beams. These arrays would require thousands of transducers each separately mounted in a plane, but until now constructing an array in this fashion would result in high production and maintenance costs, large mounting areas and an unreliable design. As such, except in a very limited sense, larger transmitting/receiving arrays such as found in phased array radar antenna technology generally or in conformal antennae technology particularly has not been possible for sonar applications. However, conformal acoustic arrays hold extraordinary possibilities for undersea sonar applications such as 3-dimensional mapping, mine hunting and mine avoidance.

Large-scale array technology needs to solve several key problems before undersea operations can exploit its potential. The prior art includes arrays such as the bow array having transducers numbering in the hundreds and assembled using conventional technology. Bow arrays in cylindrical form are appendages to a ship and incapable of a fully streamlined integration into a hull design. Also, to conserve space and to minimize hull penetrations, the drive, and receive circuitry of large arrays would have had to be co-located in the proximity to the transducers and outside the vessel's hull requiring low voltages yet very high electric fields to exploit advanced transduction materials. Furthermore, array elements would have to be nearly identical in their input impedance characteristics in that the sheer numbers of elements contemplated would not permit individualized transformers/tuning circuits.

The curvature of the hull surface, to which a conforming array would be mounted, typically presents the designer with challenges because of dimensional instability and size. For example, expansion and contraction of such an array under environmental influences changes element-to-element separation. These types of problems tend to degrade the shape, gain, and sidelobes of electronically scanned beams. Accurate beamforming and shaping is therefore difficult to achieve because a ship's surface expands and contracts significantly due to density and temperature variations and tends to flex under the force of required maneuvering.

Sonar systems widely employ transmitting and receiving transducers utilizing the tonpilz configuration. These devices have a tail mass at a proximal end and a head mass at a distal end. Between these two ends piezoelectric ceramic element drivers extend longitudinally between and in physical contact with the head mass and the tail mass. A tie rod maintains the stack of drivers under a compressive stress. Excitation of the drivers at a frequency of resonance causes the head and tail masses to oscillate at a longitudinal frequency to provide a sonar signal.

Conventional tonpilz configuration technology has not been sufficiently adaptable to large-scale array applications, at least in part because conventional manufacturing processes make it difficult to control the input impedance that in some instances requires individualized transformers/tuning circuits. Further, the technology does not facilitate close electrode coupling due at least in part to the use of cemented joints between piezoelectric elements. Finally, requirements for electrode foils, cementing, and soldering when applied to the thousands of transducers required for one array, make the conventional technology impractical for many applications such as conformal transducer array applications. A means for producing high electric fields from low voltage for high-power transduction in conformal array applications is desired.

SUMMARY

One embodiment of the invention is a process for fabricating a tape cast ceramic one-piece multi-layer piezoelectric stack utilized as a sonar transducer element driver. The process includes: (a) forming a slurry by mixing ceramics, powders, and binders; (b) filtering the slurry; (c); casting the slurry into a thin film tape (d) drying the cast; (e) removing the film when dried and (f) layering into stacks; (g) screening a pattern of conductive platinum ink onto a desired layer to form electrodes; (h) repeating the process f-h until a desired tape thickness is achieved; (i) indexing (j) heating and pressurizing to form layers into a green body of piezoelectric material with an internal electrode layer pattern; (k) burning the green body to remove the binder; (l) sintering the body to produce a final density; (m) dicing the body to expose the desired electrode polarities; (n) lapping to expose the electrodes (o) applying a strip of conductive material to connect the electrodes of like polarity; and (p) applying an electric field to achieve final polarization of the piezoelectric ceramic.

Another embodiment is a tape cast ceramic one-piece multi-layer piezoelectric stack utilized as a sonar transducer element driver.

According to yet another aspect, a tape cast ceramic sonar transducer array conforms to the shape of a ship hull and has multiple tape cast panels, each capable of operating as an electronically scanned sonar, and each capable of independently forming, steering, and shaping transmit and receive beams without the need for individualized tuning circuits. A signal switching distribution network allows transmit power and requisite sonar and control signals to be sent to and received from selected transducers or subsets of the panels. A processor coherently combines the return signals received from selected transducers or subsets of the panels for a wide range of undersea applications. The tape cast ceramic sonar transducer array provides a low voltage, yet very high electric field for high-power transduction in conformal array applications, for example on a ship's hull, which require low voltage outboard electronics. Advanced high-power drive materials, for example, Lead Magnesium Niobate, may be exploited by producing high electric field biasing and drive fields at low voltages.

BRIEF DESCRIPTION OF THE DRAWINGS

The objects and advantages of the subject matter of this application will be apparent upon consideration of the following detailed description, taken in conjunction with accompanying drawings, in which like reference characters refer to like parts throughout, and in which.

DETAILED DESCRIPTION

Figure 1:
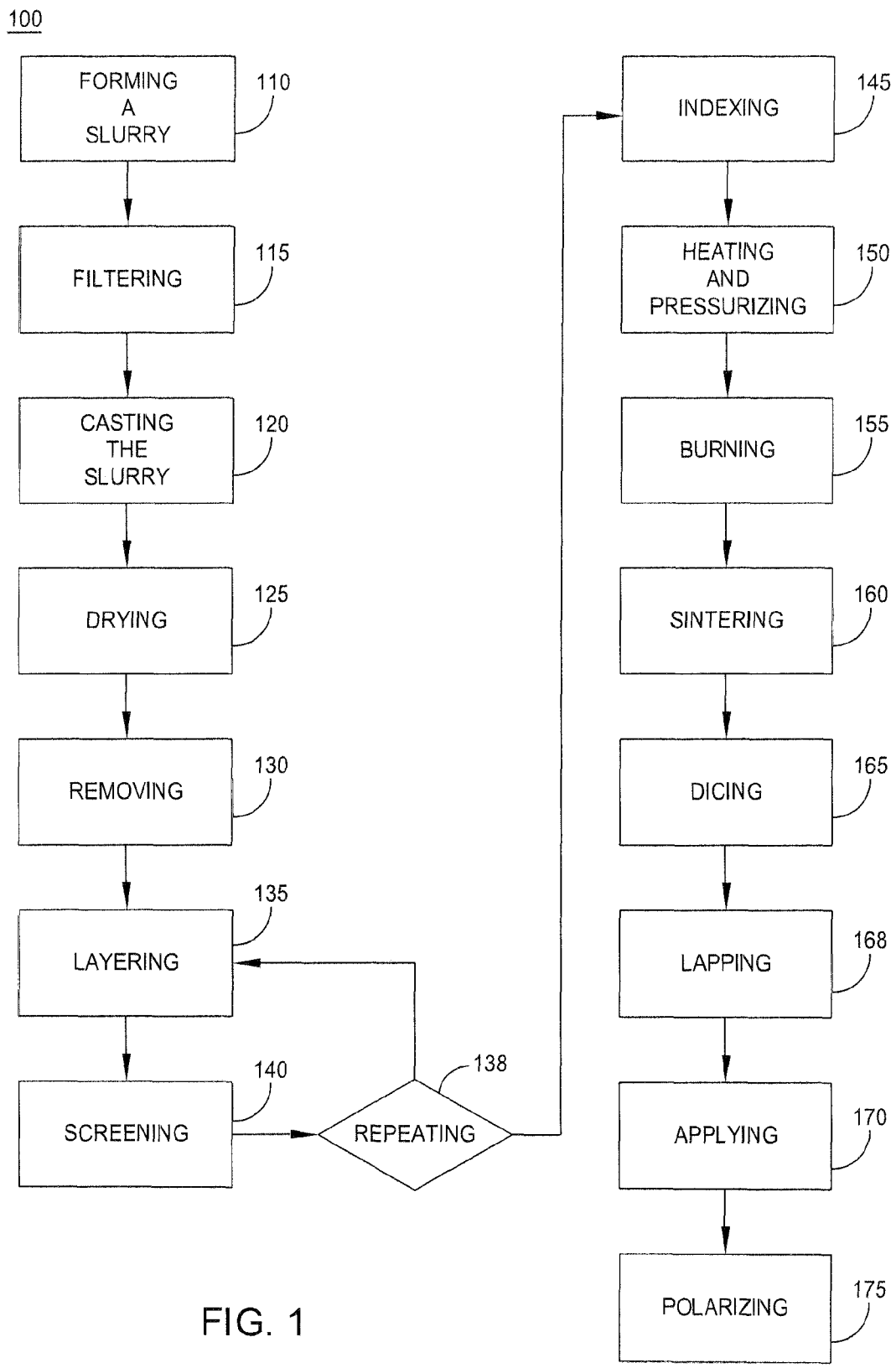
FIG. 1 is a process flow for producing a tape cast, one-piece multi-layered piezoelectric stack according to an exemplary embodiment.

FIG. 1 shows one embodiment of the inventive process 100 for making a one-piece multi-layer piezoelectric stack by forming a slurry 110 by mixing finely controlled piezoelectric ceramic powder, a solvent and binders. The second step requires filtering the slurry 115, de-airing the mixture and then casting 120 a piezoelectric body several inches wide onto a moving substrate carrier producing a ceramic material having a thickness in a range of 0.002-0.020 inches. The piezoelectric material may comprise a PZT ceramic film, by way of example. The ceramic coated substrate carrier traverses through a low temperature oven, (e.g., typical range of 125-225 degree F.). Through a process of drying 125, the volatile organic materials are evaporated or burned off. When the film drying 125 is complete removing 130 the tape strips it from the substrate carrier. Layering 135 stacks the film atop one another. After layering 135 creates a specified stack thickness, selected layers have electrodes applied by screening 140 a pattern of conductive noble material such as silver, gold alloy or a platinum ink onto the desired layer. In one non-limiting embodiment one pattern produces a conductive film over a portion of a contiguous plane surface that covers three of the four edges of one layer. The pattern is alternately flipped about the vertical axis of a stack to produce a conductive coating representing corresponding alternate polarities. Repeating 138 the process of stacking layers by layering 135 strips of tape atop one another results in a final desired stack thickness. Indexing 145 the electrode pattern exposes the desired polarity, after dicing 165 the body into separate stacks. Heating (e.g., 150-300 degrees F. (Fahrenheit)) and pressurizing (1,000-5,000 p.s.i.) 150 the stack-up of layers consolidates them to form a contiguous body with an internal pattern of electrodes. Burning at 800-1500 degrees F. 155 removes the binder and sintering at 2102 to 2417 degrees F. 160 produces a final density and desired mechanical strength. Dicing 165 the solid body using a precision dicing saw produces individualized sonar transducer tape cast stacks. The process of dicing 165 marginally exposes the desired electrode polarities on two of the four sides of the stack. Lapping 168 individual stacks clearly exposes the desired electrodes. Applying 170 a strip of fired silver soldered wire, silver termination ink or conductive epoxy connects the electrodes of like polarity (positive on one side and negative on the other) to wire the transducer element stack. Polarizing of the piezoelectric element 175 is performed at 212-257 degrees F. under 50-80 volts per thousandth of an inch of ceramic thickness between electrode layers.

In production, the process 100 has the ability to generate hundreds or thousands of individualized finished stacks each requiring very little labor. Furthermore, each may be produced at a cost of approximately one tenth of the cost of producing a conventional stack. Once assembled, the stacks provide approximately a 10%-15% improvement in electromechanical coupling efficiency over a conventional stacked element transducer due at least in part to the absence of cement joints. Furthermore, the stacks have nearly identical impedance with respect to the neighboring stacks without the need for individualized tuning circuits.

Figure 2:
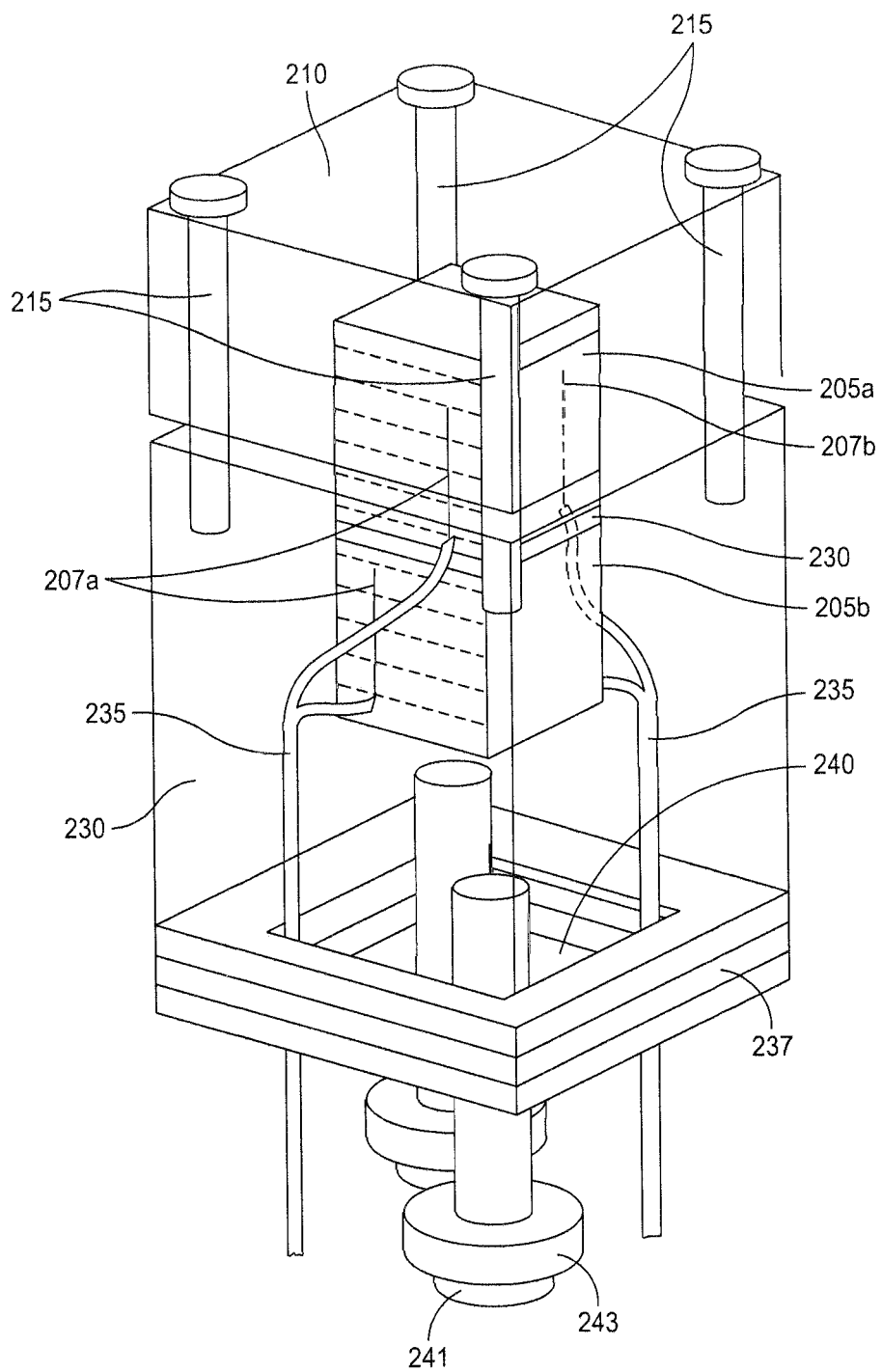
FIG. 2 is a semi-transparent isometric view showing a tape cast transducer element according to an exemplary embodiment.

FIG. 2 shows finished tape cast stacks such as 205a and 205b and not the individual layers of tape. The tape cast stacks 205a and 205b, are placed into a sonar transducer element assembly 200, each separated by insulating layer 230. Each stack 205a, 205 may contain by way of a non-limiting example 20-30 active layers. In one non-limiting embodiment of the invention, the element assembly 200 comprises a folded low-density high stiffness magnesium aluminum alloy head mass 210. A tail mass 220 includes a folded high-density tungsten alloy. Tie-rods 215 serve to connect the head mass 210 and the tail mass 220 to contain the stacks 205a, 205b in a rigid assembly under compression. In the embodiment described, electrodes 207a, 207b of like polarity are clad 225 using silver ceramic wiring to effectively connect the elements in each stack 205a, 205b in parallel. The positive electrodes 207a on stack 205a are all electrically joined and the negative electrodes 207b on stack 205b are likewise electrically joined; each of the positive and negative electrodes are electrically isolated from one another. On the rear side of the stacked assembly (not shown) positive electrodes 207a are electrically coupled together for stack 205b and the negative electrodes 207b are likewise electrically coupled to stack 205a; the positive and negative electrodes are also electrically isolated from one another. The stacks 205a, 205b electrical signals interface through the electrodes 207a, 207b via leads 235 having four conductors that attach clad 225 to an input/output port 240 formed into an isolation layer 237. The transducer element 200 may be fastened to an array or module using array plate fasteners 241 and isolating washer 243.

Figure 3A:
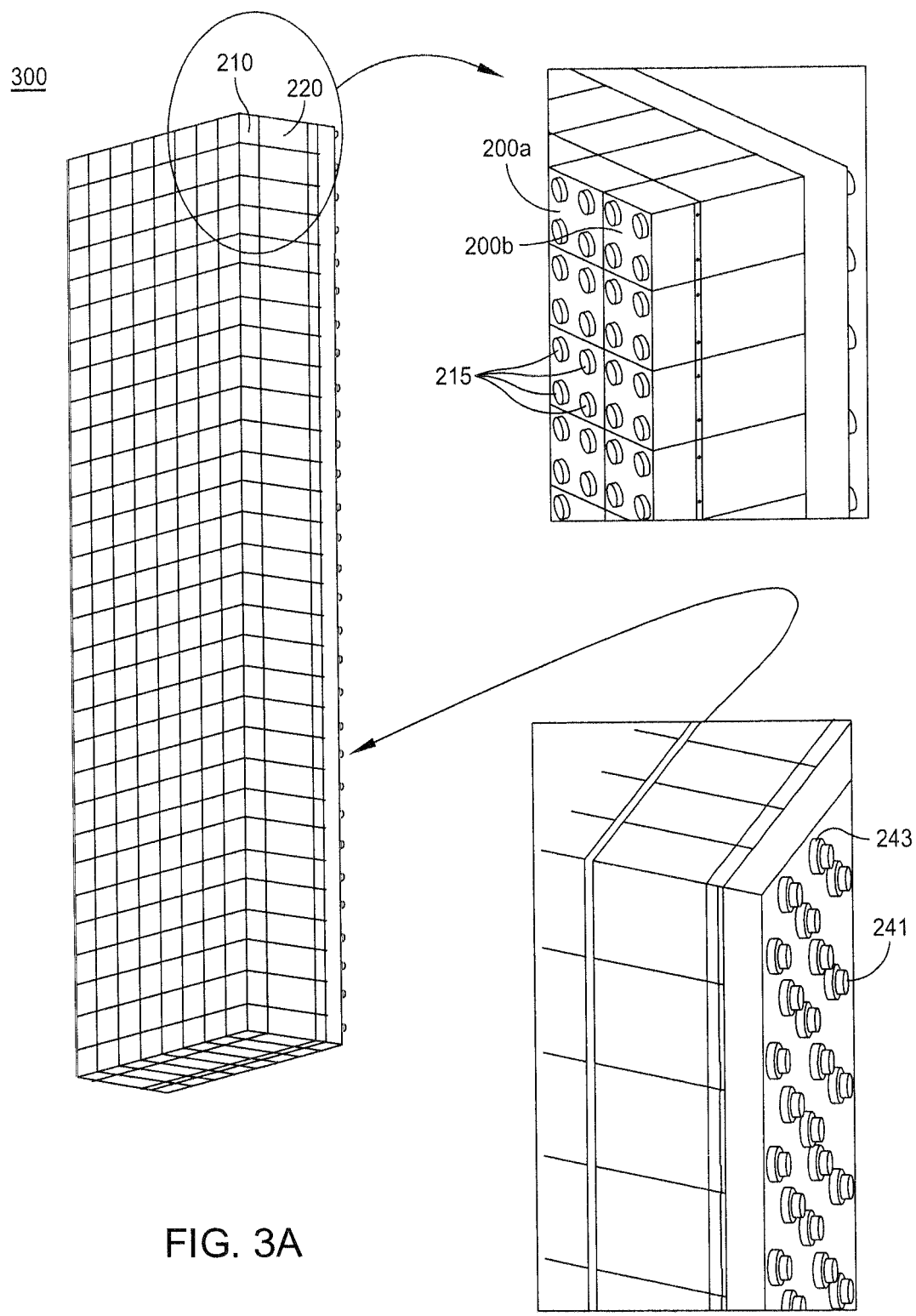
FIG. 3a is an isometric view of a 8×30 element transducer module according to an exemplary embodiment.

FIG. 3a shows a plurality of finished sonar transducer element assemblies 200, such as 200a and 200b assembled into a module 300. Each module 300 may by way of a non-limiting example contain 30 to 36 element assemblies 200 in the vertical direction. FIG. 3a shows module 300 as containing 8 element assemblies 200 in the horizontal direction and 30 element assemblies 200 in the vertical direction. The module 300 contains isolation washers 243 and fasteners 241.

Figure 3B:
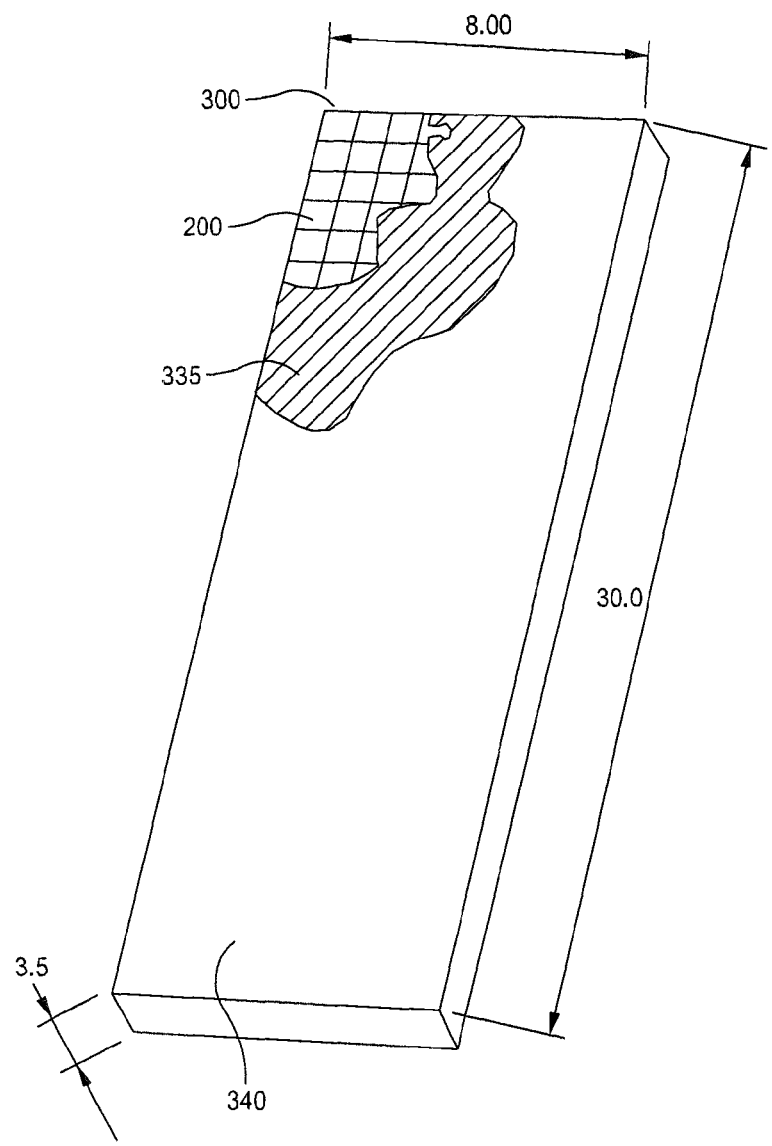
FIG. 3b is an isometric, partial cut away view of an encapsulated 8×30 element transducer module according to an exemplary embodiment.

In the example of FIG. 3b, the module 300 contains 240 tape cast sonar transducer element assemblies 200 arranged as 8 element assemblies in the horizontal direction and 30 element assemblies in the vertical direction. The module 300 measures 30 inches (30 in.) in the vertical direction, 8 inches in the horizontal direction, and 3.5 inches in depth. A titanium moisture barrier 335 covered by a vulcanized rubber seal 340 permits the module 300 to be employed in an underwater application without degrading performance.

The stacks may be assembled into the transducer element assembly 200 as one contiguous stack or a plurality of stacks. The embodiment illustrated in FIG. 2, depicts two stacks 205a and 205b. In a non limiting embodiment illustrated in FIG. 4 a transducer element assembly 400 has a vertical body length of 2.3 inches containing one stack 405 having electrodes 407 with a nominal 50 mil separation. The head mass 415 is composed of magnesium-aluminum alloy having a square top dimension of 0.9×0.9 inches. A tail mass 430 also measures 0.9×0.9, in a square dimension. The stack 405 uses a conductive epoxy to form the positive electrode wire 420 and a conductive epoxy to form a negative electrode wire 435. Two washers 410, 425 electrically isolate the stack 405 from the transducer element assembly 400.

Figure 4:
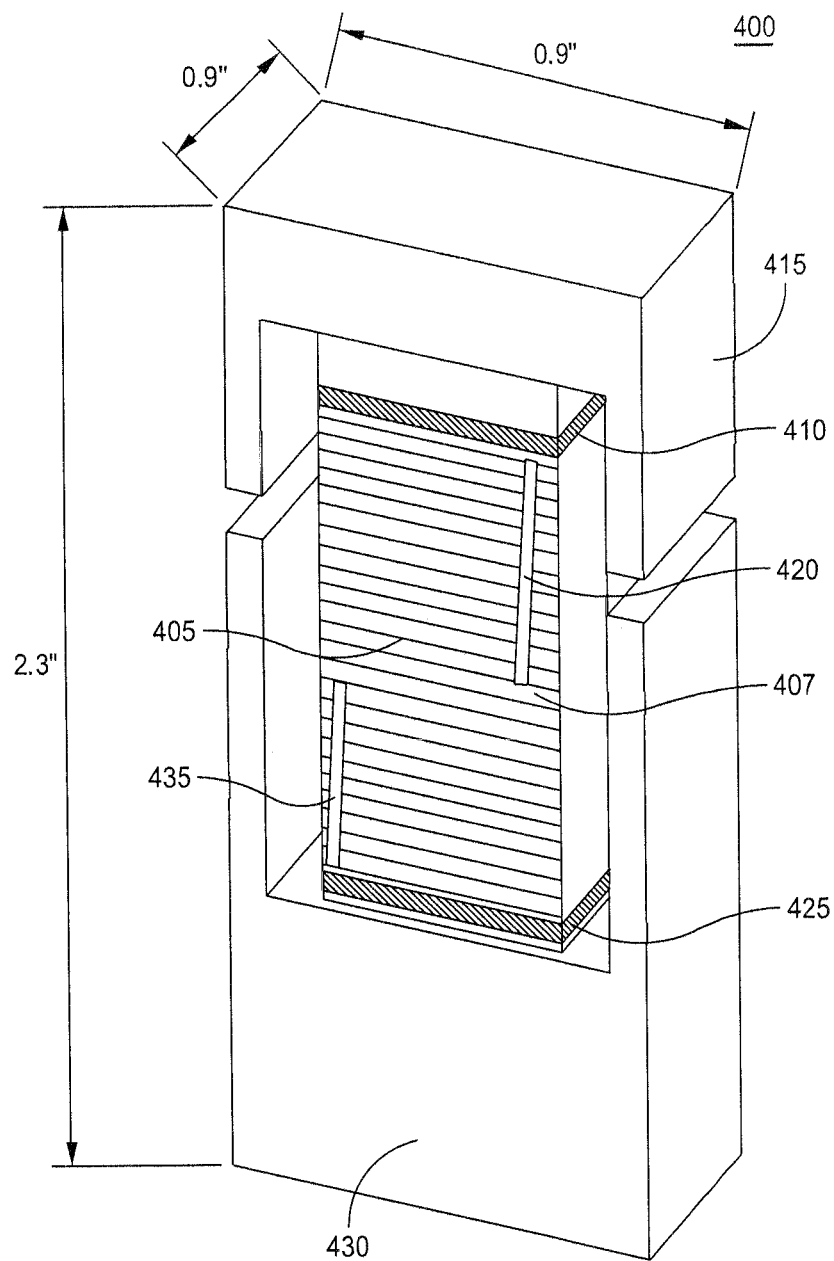
FIG. 4 is an isometric partial cut away view of a single element tape cast transducer assembly according to an exemplary embodiment.
Figure 5:
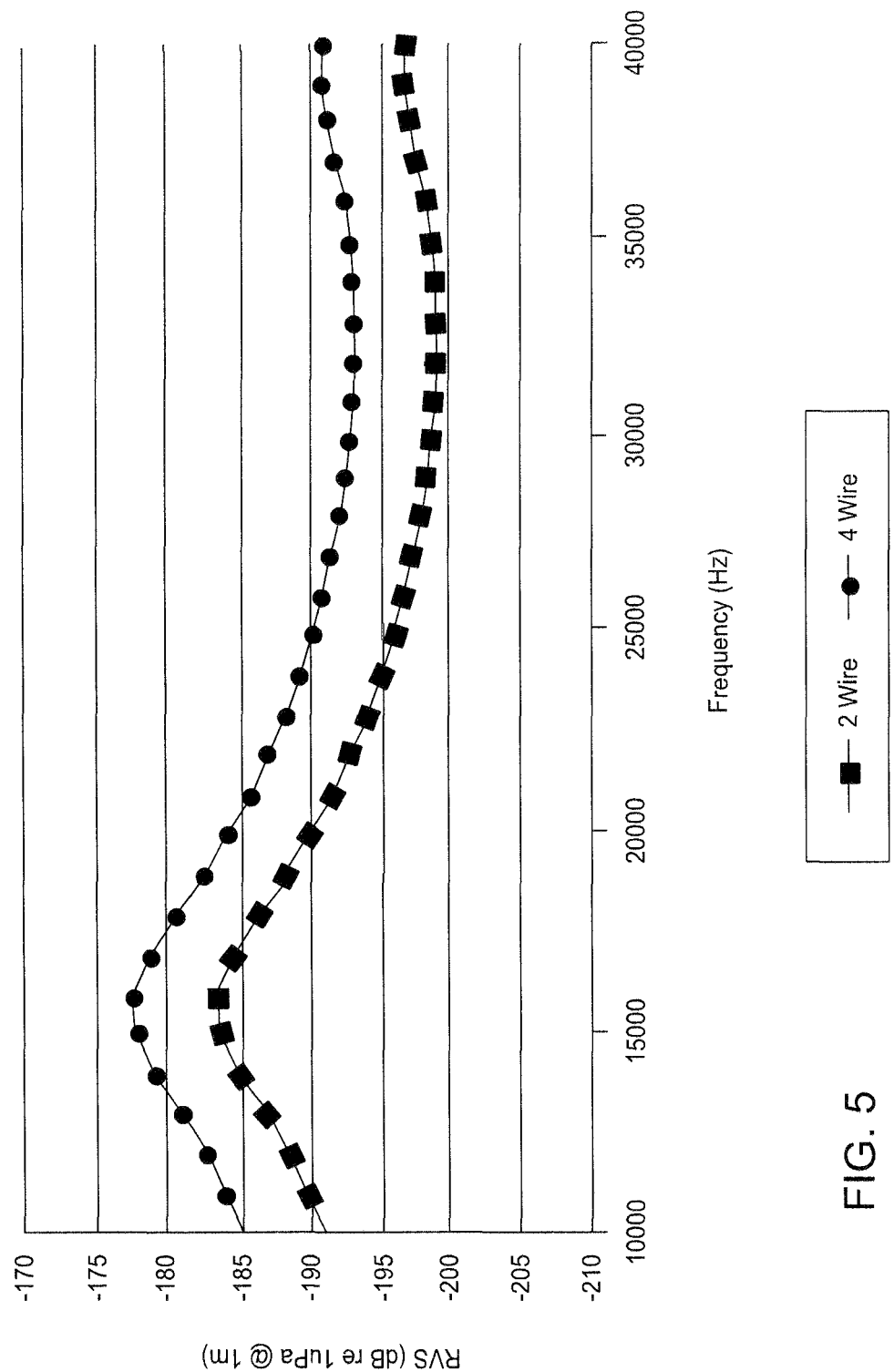
FIG. 5 is a graph showing frequency response from a simulation of two different configurations of a tape cast transducer element according to an exemplary embodiment.

FIG. 5 shows a comparison in the performance between a double stack transducer element assembly as shown in FIG. 2 and a single stack transducer element assembly as for example shown in FIG. 4. As utilized in a transmit mode, the double stacks in FIG. 2 were connected in parallel. In a receive mode the double stacks were connected in a series mode. The graph in FIG. 5 shows the partitioning of the stack into 2 half stacks, referred to as the 4-wire design as having a 6 db improvement over the one stack 2 wire design.

Figure 6B:
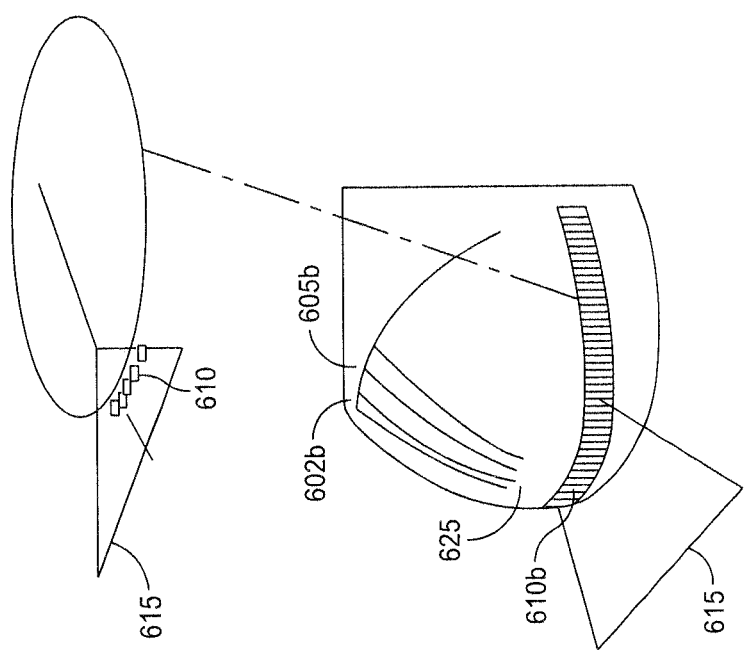
FIG. 6b illustrates a conformal mounting of a sonar array on a singly-curved surface of a ship according to an exemplary embodiment.
Figure 6A:
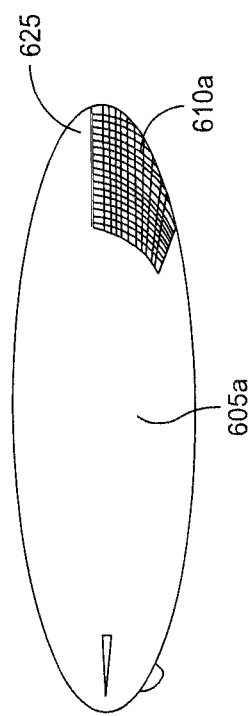
FIG. 6a illustrates a conformal mounting of a sonar array on a doubly-curved surface of a ship according to an exemplary embodiment.

FIG. 6a and FIG. 6b show ships 605a and 605b having conic section surface curvatures 602a and 602b that change continuously over surface 625. Tape cast sonar transducer array formations 610a and 610b, as illustrated, provide virtually instantaneous scan capability over a maximum 180° azimuth and elevation without degrading inertial effects and without mechanical scan losses. According to an exemplary embodiment, array 610a on the doubly-curved surface 602a continuously changes its radiating and receive element-to-element orientation in two dimensions to maintain conformality. According to another exemplary embodiment, array 610b on the singly curved surface 602b continuously changes its radiating and receive element-to-element orientation in one dimension to maintain conformality. Sonar transducer array formations 610a, 610b may be mounted either internal to the ship surface 605a, 605b respectively or upon the exterior surface 605a, 605b hull.

The manufacturing and construction costs associated with conformal approaches are generally high, at least in part due to the variable surface curvature that requires the sub-panels constituting an array to conform. However, the encapsulated module illustrated in FIG. 3b would reduce the cost associated with the surface curvature since each module would form a discrete and small chordal section along the curve. The plurality of finished sonar transducer element assemblies 200, such as 200a and 200b assembled into a module 300 are applied end to end such that the module to module linear dimension is relatively small (e.g. approximately one-inch linear dimension for each tape cast sonar transducer element produces a 30 inch by 8 inch module) compared to radius of curvature as of the hull of, for example a Virginia Class Submarine (Length: 377 ft., Beam: 34 ft.) as illustrated by subtended angle 615, thus rendering insignificant any curvature anomaly.

Figure 7:
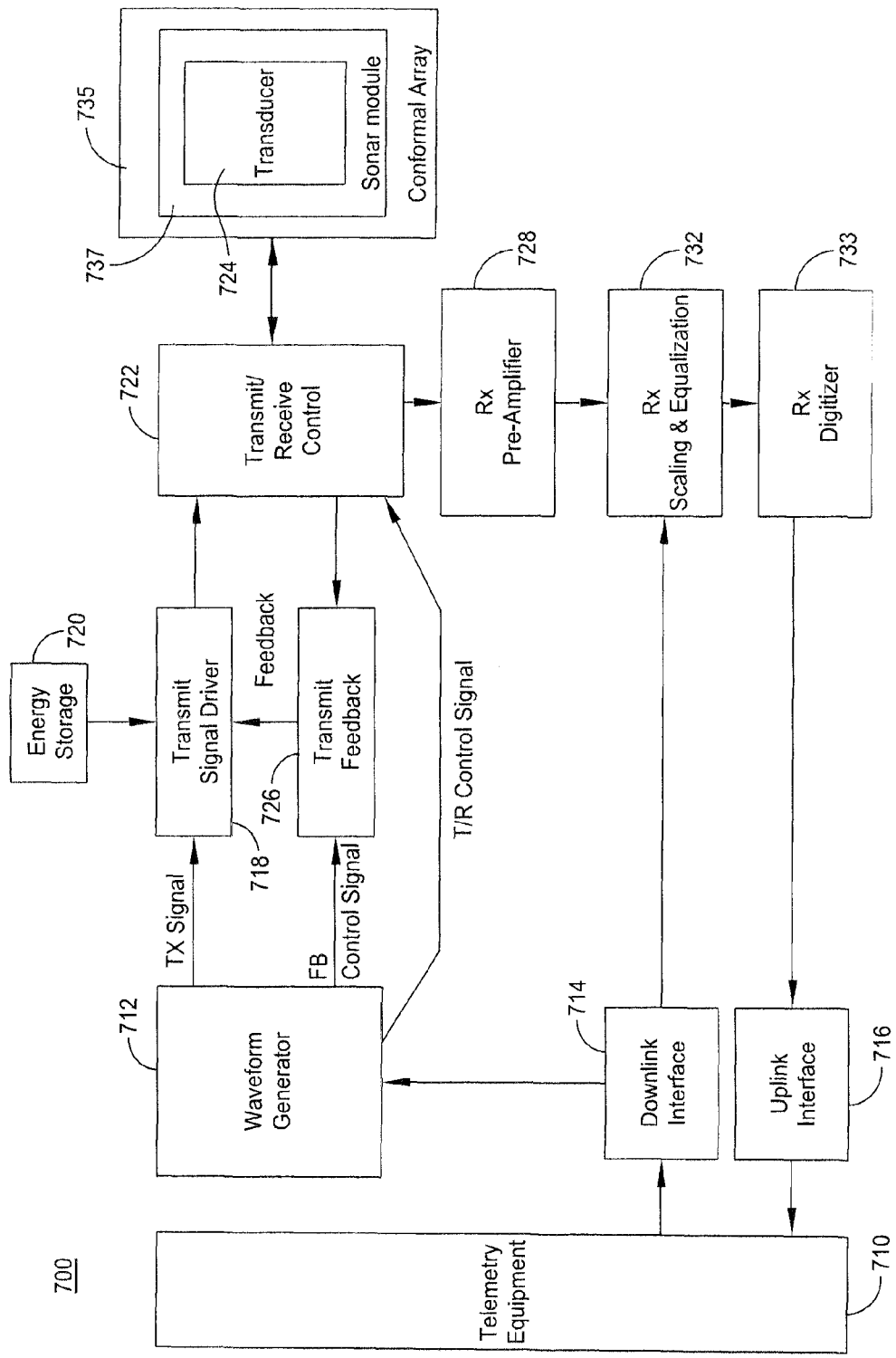
FIG. 7 illustrates a system for transmitting and receiving tape cast transducer signals according to an exemplary embodiment.

FIG. 7 discloses a system 700 that integrates tape cast sonar transducers elements 724 arrayed in a conformal application so as to transmit and receive sonar signals from underwater targets. A tape cast ceramic sonar transducer array 735 conforms to the shape of a ship hull and has multiple tape cast transducer element module panels 737, each capable of operating as an electronically scanned sonar, and each capable of independently forming, steering, and shaping transmit and receive beams. A signal switching distribution network 722 allows transmit power and requisite sonar and control signals to be sent to and received from selected transducer elements 724 or subsets of the panels 737. A processor coherently combines the return signals received from selected transducers 724 or subsets of the panels 737 for a wide range of undersea applications. A waveform generator 712 produces stable waveforms with unique frequencies and phase characteristics for each one of the tape cast sonar transducer elements 724. The transmitter signal driver 718 receives its power from energy storage device 720 and outputs a transmit signal to transmit/receive function 722. Function 722 serves to switch or direct inputs and outputs from a tape cast sonar transducer element 724 module 737 or array 735.

As indicated transmit/receive function 722 directs the tape cast sonar transducer elements 724 received acoustic signals from the synchronized transmissions produced by transmitter signal driver 718. The return signal also provides data to transmitter feedback conditioning and processing function 726 to adjust the waveform generator output 712 to condition subsequent wave form transmissions.

The receptions from the tape cast sonar transducer elements 724 are processed and uplinked through an uplink interface 716 to telemetry equipment 710. In its broad operational aspect, radio telemetry equipment 710 serves as a communication link between the underwater acoustic transmitting/receiving portion of the system 700 and a remote central station such as a surface ship via a transmission antenna not shown. The telemetry 710 houses a transmission device operably coupled to a transponder system not shown. The telemetry 710 transmission device transmits data received from the transponder system as electromagnetic energy in a particular frequency range exchanging digital control signals between the surface central station and the ship that has thereon installed system 700. Telemetry 710 transmits a received signal digitizer 733 data over the airwaves. In certain applications, the ship-to-telemetry 710 communication downlinks 714 data to serve as a remote control of both telemetry and system 700. In the embodiment shown in FIG. 7 the downlink 714 controls the waveform generator 712 and the receiver scaling and equalization 732.

A digital receive sub system comprised of a preamplifier 728, a scaling & equalization module 732 and the receiver digitizer 733 provides amplification of the sound signal received at each tape cast sonar transducer element of an array as for example described in reference to FIG. 6a, FIG. 6b. The digital receive sub system may also provide for a direct per channel analog-to-digital conversion of the sound signal; a digital memory to provide delays for focusing; and digital summation of the focused signals from all the channels. Other processing features of the digital receive system include phase rotation of a receive signal on a channel-by-channel basis to provide fine focusing, amplitude scaling (apodization) to control the beam sidelobes, and digital filtering to control the bandwidth of the signal.

Figure 8:
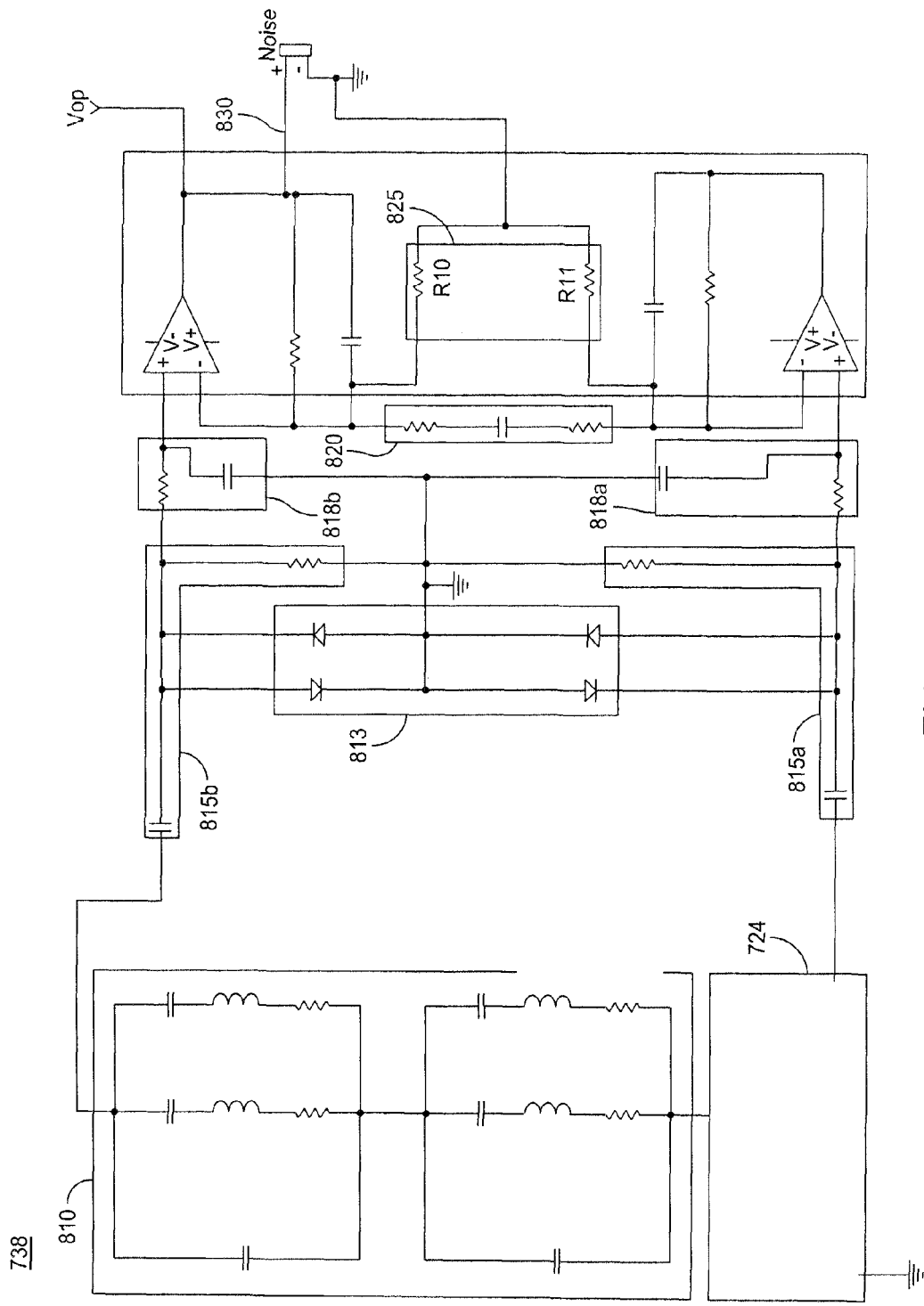
FIG. 8 illustrates a circuit for receiving tape cast transducer signals according to an exemplary embodiment.

FIG. 8 shows a pre amplifier circuit 738 that serves to receive the sonar transducer tape cast sonar transducer elements 724. The preamplifier tracks DC voltage changes out of the transducer over a specified rate of ascend and descend. Two series half stack receive networks 810 are tuned to receive a bi polar signal (e.g. 482 Hz transducer signal) for low noise amplification. A high pass filter having a 6 db break point corresponding to the signal (e.g. a break point of 482 Hz) is provided by RC network 815a, 815b. Diodes 813 serve to provide differential and common mode over voltage protection. Low pass RC network 818a, 818b protect against RF rectification by filtering correlated noise. RC network 820 serves as an equalizer to balance the inputs to output linear amplifying system 830. Resistors network 825 comprised of resistors R10 and R11 provide a differential calibration input.

Figure 9:
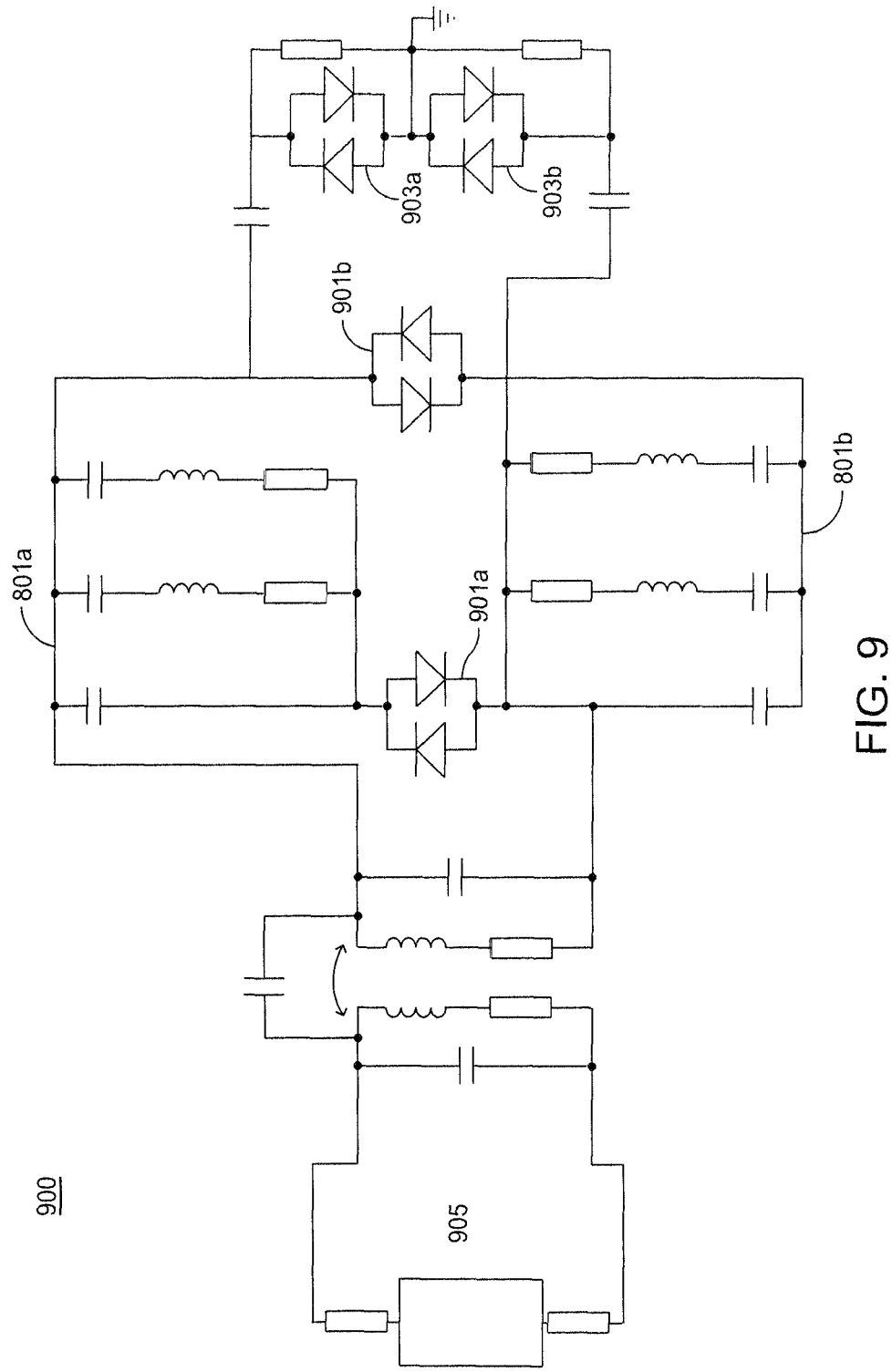
FIG. 9 illustrates a circuit for transmitting tape cast transducer signals according to an exemplary embodiment.

FIG. 9 illustrates an exemplary embodiment of a circuit for transmitting a tape cast transducer signal. The embodiment of transmitter 900 uses diodes to provide load compensation and load switching between transmit and receive operational modes. A tape cast multi-layer transducer element comprises an element driver having two piezoelectric half stacks 801a and 801b coupled by diode arrangements 901a and 901b. Diode arrangements 901a, 901b compensate for load imbalances between the two half stacks 901a, 901b. Diode arrangements 903a and 903b are also coupled between half stacks 801a, 801b to provide switching capability between transmit and receive modes for half stacks 810a and 810b, respectively. Diodes 903a are configured in opposite polarities such that biasing diodes 903a cause the circuit flow to proceed through diode 903a in a direction dictated by the biasing voltage. Diodes 903b operate in a similar manner with respect to circuit flow control for half stack 810b. The transmitter 900 is powered by a voltage controlled voltage source 905.

While the foregoing invention has been described with reference to the above described embodiment, various modifications and changes can be made without departing from the spirit of the invention. Accordingly, all such modifications and changes are considered to be within the scope of the invention.

What is claimed is:

1. A method for fabricating a transducer element driver comprising:
    forming a slurry by mixing ceramics, powders, and binders;
    filtering the slurry and casting the filtered slurry into a thin film tape;
    drying the thin film tape;
    layering the thin film tape into stacks of a given thickness;
    applying a conductive ink onto a target layer to form electrodes;
    heating and pressurizing to form layers in a piezoelectric body with an internal electrode layer pattern;
    removing the binder from the piezoelectric body;
    sintering the piezoelectric body to produce a final density;
    dicing the sintered piezoelectric body to expose the desired electrode polarities;
    lapping to expose the electrodes;
    applying a strip of conductive material to connect electrodes having a same desired electrode polarity;
    polarizing the piezoelectric body.

2. The method of claim 1, wherein the conductive ink is platinum based.

3. The method of claim 1, further comprising applying a backing material at an end of the stack for secondary resonance.

4. The method of claim 1, wherein the thickness of the piezoelectric body is in a range of about 0.002 to 0.020 inches.

5. The method of claim 1, wherein the step of heating comprises heating to about 150-300 degrees Fahrenheit and pressurizing to about 1,000-5,000 p.s.i.

6. The method of claim 1, wherein the step of removing the binder from the piezoelectric body comprises burning the body.

7. The method of claim 1, wherein the strip of conductive material is conductive silver termination ink.

* * * * *